United States Patent
Lerner et al.

(10) Patent No.: US 12,043,895 B2
(45) Date of Patent: Jul. 23, 2024

(54) METHODS OF USING A SEGMENTED SHOWERHEAD FOR UNIFORM DELIVERY OF MULTIPLE PRE-CURSORS

(71) Applicant: APPLIED MATERIALS, INC., Santa Clara, CA (US)

(72) Inventors: Alexander Lerner, San Jose, CA (US); Prashanth Kothnur, San Jose, CA (US); Roey Shaviv, Palo Alto, CA (US); Satish Radhakrishnan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 18/072,711

(22) Filed: Dec. 1, 2022

(65) Prior Publication Data
US 2023/0092987 A1    Mar. 23, 2023

Related U.S. Application Data

(62) Division of application No. 16/570,317, filed on Sep. 13, 2019.
(Continued)

(51) Int. Cl.
C23C 16/455    (2006.01)

(52) U.S. Cl.
CPC .. *C23C 16/45565* (2013.01); *C23C 16/45525* (2013.01); *C23C 16/4557* (2013.01); *C23C 16/45574* (2013.01)

(58) Field of Classification Search
CPC .......... C23C 16/45565; C23C 16/4557; C23C 16/45574; C23C 16/45525
See application file for complete search history.

(56) References Cited

U.S. PATENT DOCUMENTS

| | | | |
|---|---|---|---|
| 5,653,806 A | | 8/1997 | Van Buskirk |
| 5,958,510 A | * | 9/1999 | Sivaramakrishnam ...................... C23C 16/44 118/724 |

(Continued)

FOREIGN PATENT DOCUMENTS

| | | |
|---|---|---|
| CN | 104278254 B | 4/2017 |
| KR | 20090131384 A | 12/2009 |

(Continued)

OTHER PUBLICATIONS

Chang, Shyy Woei, et al., "Thermal performance of radially rotating trapezoidal channel with impinging jet-row". International Journal of Heat and Mass Transfer 136 (2019) 246-264.*

(Continued)

*Primary Examiner* — Bret P Chen
(74) *Attorney, Agent, or Firm* — Moser Taboa (57) ABSTRACT

Methods of introducing precursors through a segmented showerhead are provided herein. In some embodiments, a method of introducing precursors through a segmented showerhead having a plurality of gas delivery portions that are fluidly isolated includes heating a first gas delivery portion to a first temperature; and simultaneously heating a second gas delivery portion to a second temperature different than the first temperature, wherein each of the first and second gas delivery portions (i) have a wedge shaped body that defines a plenum, (ii) are coplanar, and (iii) together form a showerhead having a circular shape.

20 Claims, 5 Drawing Sheets

Related U.S. Application Data (60) Provisional application No. 62/731,799, filed on Sep. 14, 2018.

(56) References Cited

U.S. PATENT DOCUMENTS

| | | | |
|---|---|---|---|
| 6,050,506 | A | 4/2000 | Guo et al. |
| 6,533,867 | B2 | 3/2003 | Doppelhammer |
| 6,821,910 | B2 | 11/2004 | Adomaitis et al. |
| 6,888,733 | B2 | 5/2005 | Jang et al. |
| 7,871,470 | B2 | 1/2011 | Schieve et al. |
| 7,976,631 | B2 | 7/2011 | Burrows et al. |
| 8,148,273 | B1* | 4/2012 | Shanker ............ C23C 16/45536 438/758 |
| 8,187,679 | B2 | 5/2012 | Dickey et al. |
| 8,216,640 | B2 | 7/2012 | Chao et al. |
| 8,293,013 | B2 | 10/2012 | DeDontney |
| 8,409,354 | B2 | 4/2013 | Chiang et al. |
| 8,440,259 | B2 | 5/2013 | Chiang et al. |
| 8,481,118 | B2* | 7/2013 | Burrows ........... C23C 16/45565 427/253 |
| 8,980,379 | B2 | 3/2015 | Hanawa et al. |
| 9,447,499 | B2 | 9/2016 | Roy et al. |
| 9,644,267 | B2 | 5/2017 | Burrows et al. |
| 9,677,176 | B2 | 6/2017 | Chandrasekharan et al. |
| 9,728,380 | B2* | 8/2017 | Mohn ............... C23C 16/45589 |
| 10,533,252 | B2 | 1/2020 | Chiu et al. |
| 11,189,502 | B2 | 11/2021 | Bera et al. |
| 2004/0082251 | A1 | 4/2004 | Bach et al. |
| 2004/0099213 | A1 | 5/2004 | Adomaitis et al. |
| 2006/0191637 | A1 | 8/2006 | Zajac et al. |
| 2006/0219362 | A1 | 10/2006 | Han et al. |
| 2007/0163440 | A1* | 7/2007 | Kim .................... H01J 37/3244 96/60 |
| 2008/0092812 | A1 | 4/2008 | McDiarmid et al. |
| 2008/0092815 | A1 | 4/2008 | Chen et al. |
| 2008/0236495 | A1 | 10/2008 | Tompa |
| 2009/0061646 | A1 | 3/2009 | Chiang et al. |
| 2009/0095222 | A1* | 4/2009 | Tam ........................ C23C 16/34 118/723 R |
| 2009/0260571 | A1 | 10/2009 | Ostrowski et al. |
| 2011/0239940 | A1 | 10/2011 | Benvenuti et al. |
| 2012/0064698 | A1 | 3/2012 | Olgado |
| 2012/0318457 | A1 | 12/2012 | Nguyen et al. |
| 2013/0042811 | A1 | 2/2013 | Shanker et al. |
| 2013/0052804 | A1* | 2/2013 | Song .................... C23C 16/4411 118/724 |
| 2013/0087093 | A1 | 4/2013 | Olgado |
| 2013/0220222 | A1 | 8/2013 | Huang et al. |
| 2013/0341433 | A1* | 12/2013 | Roy .................. C23C 16/45565 239/548 |
| 2014/0030433 | A1* | 1/2014 | Ranish .................... C23C 16/24 118/728 |
| 2014/0166616 | A1 | 6/2014 | Shanker et al. |
| 2014/0251209 | A1 | 9/2014 | Obu et al. |
| 2016/0240405 | A1 | 8/2016 | Francischetti et al. |
| 2016/0273108 | A1 | 9/2016 | Ge et al. |
| 2016/0340782 | A1 | 11/2016 | Chandrasekharan et al. |
| 2017/0167024 | A1* | 6/2017 | Wiltse ............... C23C 16/45565 |
| 2017/0191159 | A1 | 7/2017 | Polyak et al. |
| 2019/0351433 | A1 | 11/2019 | Mustafa et al. |
| 2020/0034739 | A1 | 1/2020 | Chung et al. |
| 2020/0048767 | A1 | 2/2020 | Kothnur et al. |

FOREIGN PATENT DOCUMENTS

| | | |
|---|---|---|
| KR | 20110133169 A | 12/2011 |
| KR | 20130139651 A | 12/2013 |
| KR | 10-2014-0103080 | 2/2014 |
| KR | 20140101049 A | 8/2014 |
| WO | WO 2008118483 A1 | 10/2008 |
| WO | WO 2012027009 A2 | 3/2012 |
| WO | WO 2020159799 A1 | 8/2020 |

OTHER PUBLICATIONS

You, Jiawen, et al., "Synthesis of 2D transition metal dichalcogenides by chemical vapor deposition with controlled layer number and morphology". Nano Convergence (2018) 5:26 pp. 1-13. https://doi.org/10.1186/s40580-018-0158-x.

Xia, Huanxiong, et al., "Experimental study of the effects of showerhead configuration on large-area silicon-nitride thin film by plasma-enhanced chemical vapor deposition". Thin Solid Films 638 (2017) pp. 1-8.

Kim, You-Jae, et al., "Effects of showerhead shapes on the flowfields in a RF-PECVD reactor". Surface & Coatings Technology 193 (2005) 88-93.

Rader, Daniel J., et al., "Showerhead-Enhanced Inertial Particle Deposition in Parallel-Plate Reactors". Aerosol Science and Technology 28:2, 105-132 (1998).

Xia, Huanxiong, et al., "Simulation-Based Optimization of a Vector Showerhead System for the Control of Flow Field Profile in a Vertical Reactor Chamber". Advances in Mechanical Engineering vol. 2014, Article ID 525102, 9 pages http://dx.doi.org/ 10.1155/2014/525102.

Kim, Ho Jun, et al., "Effects of the wall boundary conditions of a showerhead plasma reactor on the uniformity control of RF plasma deposition". Journal of Applied Physics 122, 053301 (2017) pp. 1-16.

Choo, Jae-Ouk, et al., "Design, Simulation, and Experimental Testing of a Spatially Controllable CVD Reactor". Advanced Control of Chemical Processes, 2003, pp. 1-6.

* cited by examiner

METHODS OF USING A SEGMENTED SHOWERHEAD FOR UNIFORM DELIVERY OF MULTIPLE PRE-CURSORS

CROSS-REFERENCE TO RELATED APPLICATIONS

This application is a divisional of U.S. patent application Ser. No. 16/570,317, filed on Sep. 13, 2019, which claims benefit of U.S. provisional patent application Ser. No. 62/731,799, filed Sep. 14, 2018, which are herein incorporated by reference in their entirety.

FIELD

Embodiments of the present disclosure generally relate to substrate processing equipment and techniques, and more particularly, to an apparatus for supplying gases to a reaction chamber.

BACKGROUND

Organic vapor deposition is becoming increasingly relevant in building semiconductor devices such as complementary metal oxide semiconductor (CMOS) image sensors (CIS) and other optical devices. However, the inventors have observed that depositing organic material on a workpiece in a deposition process is problematic due to purity and/or contamination concerns that, among other things, prevent the use of a carrier gas.

Often, there is a need to deposit more than one material at a time. However, in some applications, the inventors have observed that co-depositing a cooler material with a warmer material can cause the cooler material to dissociate and cause the warmer material to condense.

Accordingly, the inventors have provided an improved apparatus for depositing multiple materials onto a substrate.

SUMMARY

Embodiments of apparatus for supplying multiple process gases, such as vaporized reactants, to a reaction chamber are described herein. In some embodiments, a showerhead assembly for depositing multiple materials on a substrate includes a plurality of gas delivery portions, each gas delivery portion having an inlet, a wedge shaped body that defines a plenum, and a plurality of openings disposed on a bottom surface of the gas delivery portion, wherein each of the plenums are fluidly isolated from each other.

In some embodiments, a showerhead assembly includes a first gas delivery portion defining a first plenum, a second gas delivery portion defining a second plenum, a third gas delivery portion defining a third plenum, and a fourth gas delivery portion defining a fourth plenum, wherein each of the first, second, third, and fourth gas delivery portions include an inlet and a plurality of openings, and wherein each of the first, second, third, and fourth plenums are fluidly isolated from each other.

In some embodiments, a method of introducing precursors through a segmented showerhead having a plurality of gas delivery portions that are fluidly isolated includes heating a first gas delivery portion to a first temperature; and simultaneously heating a second gas delivery portion to a second temperature different than the first temperature, wherein each of the first and second gas delivery portions (i) have a wedge shaped body that defines a plenum, (ii) are coplanar, and (iii) together form a showerhead having a circular shape.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. The appended drawings illustrate some embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of apparatus for processing a substrate and/or providing multiple process materials to a deposition chamber are provided herein. The apparatus of the present disclosure includes a showerhead assembly and/or delivery system configured to advantageously prevent thermal crosstalk between two or more adjacent process fs before exiting the delivery system. For example, two or more species or samples of process material may be individually processed through the apparatus in thermal isolation, or relative thermal isolation, at the same or different temperatures prior to exiting a showerhead assembly and depositing on a substrate. The apparatus of the present disclosure advantageously reduces a pressure drop across a showerhead assembly. Although the process may be described in terms of organic thin films deposited, grown, or condensed on a substrate or workpiece, the process of the present disclosure may be applied to any substrate process that requires delivery of multiple process materials, and in particular, in such processes where the multiple process materials are beneficially isolated from each other in accordance with the teachings provided herein.

Figure 1:
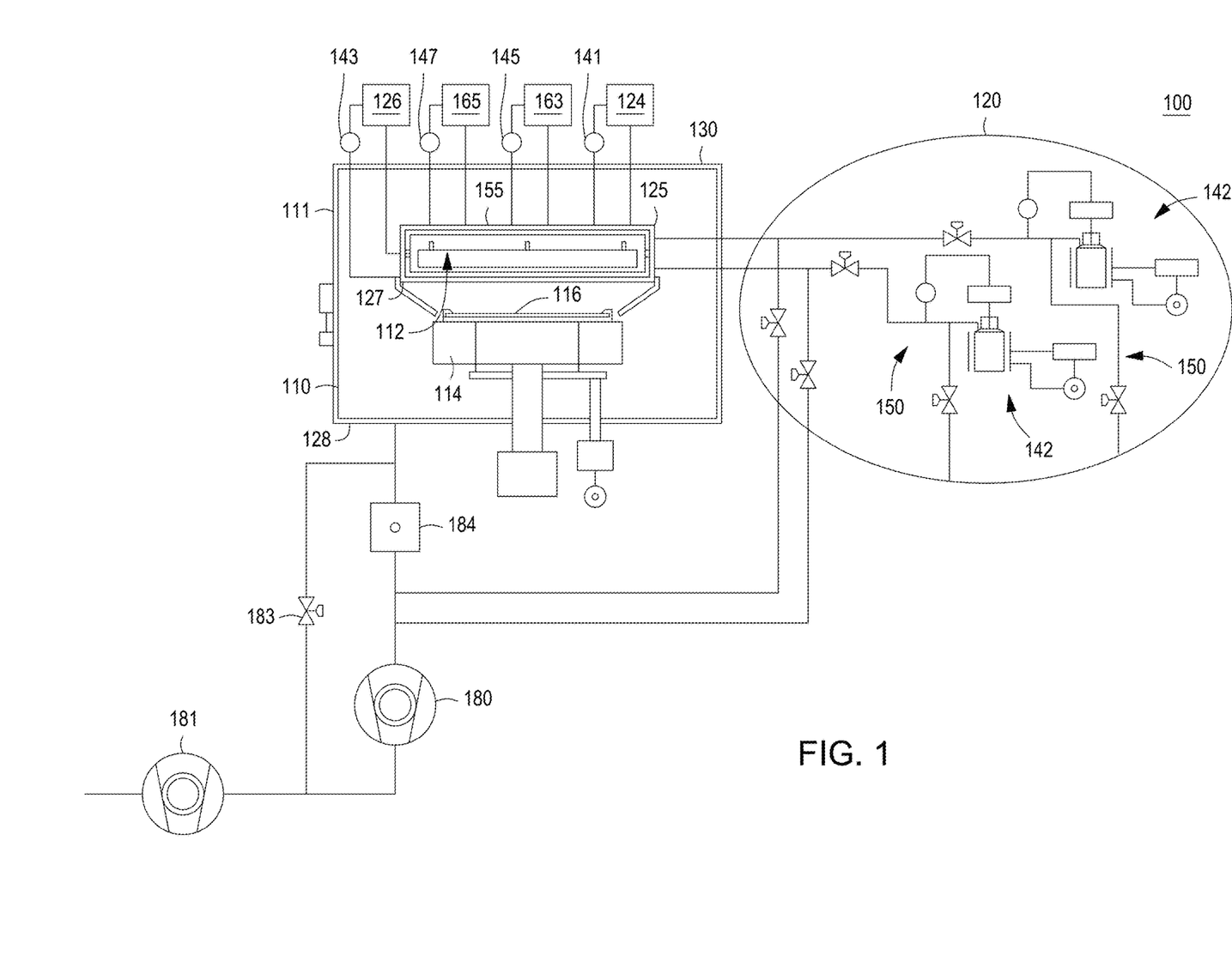
FIG. 1 shows a schematic side view of a deposition system having a showerhead assembly in accordance with some embodiments of the present disclosure.

FIG. 1 shows a schematic side view of a deposition system 100 in accordance with some embodiments of the present disclosure. The deposition system 100 includes a deposition chamber 110 defined, at least in part, by one or more sides 111, a floor 128, and a lid 130. The deposition system 100 is configured to process a substrate, such as substrate 116, in the deposition chamber 110. The substrate is supported by a substrate support 114 disposed in the deposition chamber 110. In some embodiments, the deposition chamber 110 may be a CVD chamber configured to perform process material deposition such as organic precursor deposition in accordance with the present disclosure. One non-limiting system suitable for use or that can be adapted for use in accordance with the present disclosure is the ENDURA® line of processing systems available from Applied Materials, Inc. of Santa Clara, CA Other processing systems, including those available from other manufacturers, can also be modified in accordance with the teachings provided herein. In some embodiments, the apparatus in accordance with the present disclosure may be utilized in a chamber configured to perform atomic layer deposition (ALD).

In some embodiments, an organic layer (not shown), or derivatives thereof may be formed, condensed, or deposited by a deposition process on substrate 116. In some embodiments, the layer may be formed of multiple process materials that would otherwise undesirably react with each other within a conventional showerhead. In some embodiments, the layer may be formed of multiple process materials that have difference process requirements, such as flow rate, temperature, or the like. In some embodiments, suitable process materials for use in the apparatus of the present disclosure include any material suitable for sublimation and condensation on a substrate, for example tris (8-hydroxyquinolinato) aluminum (Alq3) or buckminsterfullerene ($C_{60}$). Other process gases may also suitably be used, in particular but not limited to, process gases that require one or more of different flow rates, different temperatures, or different gas distribution systems to prevent reactions between the respective process gases within the gas distribution system.

The deposition system 100 includes the deposition chamber 110 and a precursor delivery system 120. In some embodiments, the precursor delivery system 120 may include one or more heating systems 142 (two shown in FIG. 1). In some embodiments, the precursor delivery system 120 may include one or more gas delivery systems 150 (two shown in FIG. 1). In some embodiments, the components of the deposition system 100 are connected and in communication such that processing material in the one or more heating systems 142 may be sublimated and subsequently passed through gas delivery system 150 into deposition chamber 110. In some embodiments, the one or more heating systems 142, the gas delivery system 150, and the deposition chamber 110 may be in fluid communication.

The precursor delivery system 120 is configured to deliver the multiple process materials to a showerhead assembly 112 and substrate 116 in fluid communication with the showerhead assembly 112. The showerhead assembly 112 includes a plurality of gas delivery portions. In some embodiments, the plurality of gas delivery portions are coplanar and together form a showerhead assembly 112 having a circular shape. The plurality of gas delivery portions are fluidly isolated from each other (e.g., material in each gas delivery portion cannot intermix with or contact the materials in other gas delivery portions within the showerhead assembly 112). The precursor delivery system 120 is capable of delivering a first process material to one or more of the gas delivery portions at a first temperature. In some embodiments, the first temperature is about 200 degrees to about 350 degrees Celsius. The precursor delivery system 120 is capable of delivering a second process material to one or more of the gas delivery portions at a second temperature different than the first temperature. In some embodiments, the second temperature is about 450 degrees to about 600 degrees Celsius. In some embodiments, the precursor delivery system 120 is capable of delivering a third process material to one or more of the gas delivery portions at the first temperature, the second temperature, or a third temperature different than the first temperature and the second temperature. In some embodiments, the precursor delivery system 120 is capable of delivering a fourth process material to one or more of the gas delivery portions at the first temperature, the second temperature, the third temperature, or a fourth temperature different than the first temperature, the second temperature, and the third temperature. In use, the substrate support 114 is capable of rotating the substrate 116 such that process materials from the plurality of gas delivery portions are uniformly deposited onto the substrate 116.

In addition to the fluid isolation provided between the plurality of gas delivery portions, in some embodiments, the plurality of gas delivery sections are further configured to reduce or prevent thermal cross-talk between each gas delivery section prior to exiting into the deposition chamber 110, as described in further detail below. For example, the temperature of the first process material will not affect, or will have a lessened effect on, the temperature of the second process material within the showerhead assembly 112. In some embodiments, a temperature difference between the first process material and the second process material is between about 200 to about 400 degrees Celsius. In some embodiments, the showerhead assembly 112 is configured to deliver process material to the deposition chamber 110 without condensing the one or more process material(s) therein.

In some embodiments, the deposition system 100 may include components used to execute and monitor pre-determined processes (e.g., depositing films) in the deposition system 100. Such components generally include various sub-systems (e.g., vacuum and exhaust sub-systems, and the like) and devices (e.g., power supplies, process control instruments, and the like) of the deposition system 100. In some embodiments, the deposition system 100 includes a first pump 180, a second pump 181, a throttle valve 184, and a pressure valve 183 to control the pressure of the system and bring or maintain the deposition system 100 at vacuum conditions. The pressure valve 183 may be included to remove vacuum conditions.

Figure 2:
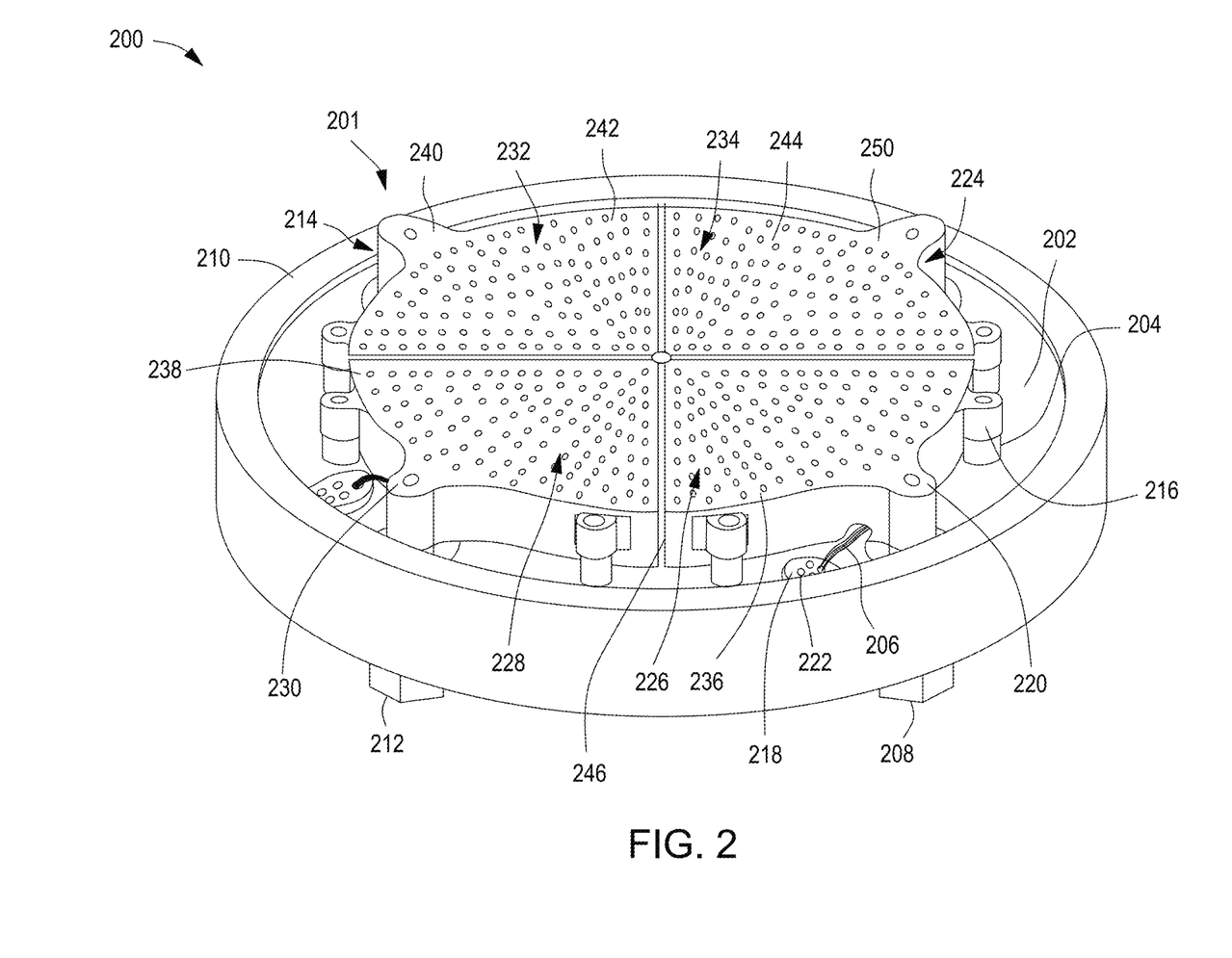
FIG. 2 shows a top isometric view of a showerhead and lid assembly in accordance with some embodiments of the present disclosure.

FIG. 2 shows a top isometric view of a showerhead and lid assembly in accordance with some embodiments of the present disclosure. As shown, the showerhead and lid assembly 200 comprises a plurality of gas delivery portions including a first gas delivery portion 220, a second gas delivery portion 230, a third gas delivery portion 240, and a fourth gas delivery portion 250. The plurality of gas delivery portions 220, 230, 240, 250 are coplanar and together form a showerhead assembly 112 having a circular shape. In some embodiments, the showerhead diameter is about 300 mm to about 500 mm. In some embodiments, the showerhead diameter corresponds with a diameter of the substrate 116. In some embodiments, the plurality of gas delivery portion can include three gas delivery portions. In some embodiments, the plurality of gas delivery portions can include six gas delivery portions. The plurality of gas delivery portions 220, 230, 240, 250 are arranged such that there is a gap 246 between each gas delivery portion. The spaced relation between the gas delivery portions 220, 230, 240, 250 advantageously reduces or prevents thermal cross-talk between each gas delivery portion prior to exiting into the deposition chamber 110.

Referring back to FIG. 1, a first heating assembly 125 is configured to apply heat to the first gas delivery portion 220. The first heating assembly 125 may comprise one or more heating elements configured to maintain the first gas delivery portion at a substantially uniform temperature. In some embodiments, the first heating assembly 125 includes a heating element, such as a resistive heater, in at least one of the top wall and the bottom wall of the first gas delivery portion 220 (discussed below). The first heating assembly 125 is configured to apply heat to a first process material passing through the first gas delivery portion 220 at a predetermined temperature, such as the first temperature, as the first process material moves into the deposition chamber 110.

In some embodiments, a one or more first temperature sensor 141 and a first temperature controller 124 are coupled to the first gas delivery portion 220. The one or more first temperature sensor 141 is configured to obtain thermal information from the first gas delivery portion 220. The first temperature controller 124 is configured to receive input from the one or more first temperature sensor 141 to control, adjust, or set a temperature of the first heating assembly 125. The first temperature sensor 141 can be a thermocouple, a pyrometer, or the like.

A second heating assembly 127 is configured to apply heat to the second gas delivery portion 230. The second heating assembly 127 may comprise one or more heating elements configured to maintain the second gas delivery portion 230 at a substantially uniform temperature. In some embodiments, the first heating assembly 125 includes a heating element, such as a resistive heater, in at least one of the top wall and the bottom wall of the second gas delivery portion 230. The second heating assembly 127 is configured to apply heat to a second process material passing through the second gas delivery portion 230 at a predetermined temperature, such as the second temperature, as the second process material moves into the deposition chamber 110.

In some embodiments, a one or more second temperature sensor 143 and a second temperature controller 126 are coupled to the second gas delivery portion 230. The one or more second temperature sensor 143 is configured to obtain thermal information from the second gas delivery portion 230. The second temperature controller 126 is configured to receive input from the one or more second temperature sensor 143 to control, adjust, or set a temperature of the second heating assembly 127. The one or more second temperature sensor 143 can be a thermocouple, a pyrometer, or the like.

A third heating assembly 155 is configured to apply heat to the third gas delivery portion 240. The third heating assembly 155 may comprise one or more heating elements configured to maintain the third gas delivery portion 240 at a substantially uniform temperature. In some embodiments, the third heating assembly 155 includes a heating element, such as a resistive heater, in at least one of the top wall and the bottom wall of the third gas delivery portion 240. The third heating assembly 155 is configured to apply heat to a process material passing through the third gas delivery portion 240 at a predetermined temperature, such as the first temperature, the second temperature, or a third temperature, as the process material moves into the deposition chamber 110. The process material may be the first process material, the second process material, or a third process material. In some embodiments, a temperature difference between the first temperature and the second temperature is between about 200 to about 400 degrees Celsius.

In some embodiments, a one or more third temperature sensor and a third temperature controller 163 are coupled to the third gas delivery portion 240. The one or more third temperature sensor 145 is configured to obtain thermal information from the third gas delivery portion 240. The third temperature controller 163 is configured to receive input from the one or more third temperature sensor 145 to control, adjust, or set a temperature of the third heating assembly 155. The one or more third temperature sensor 145 can be a thermocouple, a pyrometer, or the like.

A fourth heating assembly 159 is configured to apply heat to the fourth gas delivery portion 250. The fourth heating assembly 159 may comprise one or more heating elements configured to maintain the fourth gas delivery portion 250 at a substantially uniform temperature. In some embodiments, the fourth heating assembly 159 includes a heating element, such as a resistive heater, in at least one of the top wall and the bottom wall of the fourth gas delivery portion 250. The fourth heating assembly 159 is configured to apply heat to a process material passing through the fourth gas delivery portion 250 at a predetermined temperature, such as the first temperature, the second temperature, the third temperature, or a fourth temperature, as the process material moves into the deposition chamber 110. The process material may be the first process material, the second process material, the third process material, or a fourth process material.

In some embodiments, a one or more fourth temperature sensor 147 and a fourth temperature controller 165 are coupled to the fourth gas delivery portion 250. The one or more fourth temperature sensor 147 is configured to obtain thermal information from the fourth gas delivery portion 250. The fourth temperature controller 165 is configured to receive input from the one or more fourth temperature sensor 147 to control, adjust, or set a temperature of the fourth heating assembly 159. The one or more fourth temperature sensor 147 can be a thermocouple, a pyrometer, or the like.

Referring back to FIG. 2, the showerhead and lid assembly 200 includes a showerhead assembly 112 mounted to a lid plate 210. The lid plate 210 has a plurality of mounts 204 extending from a bottom surface 202 of the lid plate 210. Each of the gas delivery portions 220, 230, 240, 250 of the showerhead assembly 112 include one or more mounts 216 that are capable of mating with corresponding mounts 204 of the lid plate 210 to couple the showerhead assembly 201 to the lid plate 210. In some embodiments, the one or more mounts 216 extend from a radially outer surface of the showerhead assembly 112. In some embodiments, the mounts 204, 216 are made of an insulative material.

In some embodiments, as shown in FIG. 2, the plurality of gas delivery portions 220, 230, 240, 250 are similar in size. In some embodiments, the plurality of gas delivery portions may be different sizes. In some embodiments, the showerhead assembly 112 is capable of flowing two process gases. For example, the first gas delivery portion 220 and the third gas delivery portion 240 are coupled to a first gas source and the second gas delivery portion 230 and the fourth gas delivery portion 250 are coupled to a second gas source. In some embodiments, the showerhead assembly 112 is capable of flowing three process gases. For example, the first and third gas delivery portions 220, 240 coupled to a first gas source, the second gas delivery portion 230 coupled to a second gas source, and the fourth gas delivery portion 250 coupled to a third gas source. In some embodiments, the showerhead assembly 112 is capable of flowing four process gases.

The first gas delivery portion 220 includes a wedge shaped body that defines a first plenum 318. The first gas delivery portion 220 includes a first inlet 208 extending from the wedge shaped body and through an opening in the lid plate 210. Similarly, the second gas delivery portion 230, the third gas delivery portion 240, and the fourth gas delivery portion 250 include a second inlet 212, a third inlet 214, and a fourth inlet 224, extending from their respective wedge shaped bodies through an opening in the lid plate 210. In some embodiments, each inlet 208, 212, 214, 224 is disposed adjacent a respective outer portion of each gas delivery portion 220, 230, 240, 250.

The first gas delivery portion 220 includes a plurality of openings 226 extending from a bottom surface 236 of the wedge shaped body to the first plenum 318. The plurality of openings 226 are configured to deliver a process gas into the deposition chamber 110. The gas delivery portions 230, 240, 250 include a plurality of openings 228, 232, 234, respectively, extending from their respective bottom surfaces 238, 242, 244. The plurality of openings 228, 232, 234 are configured to deliver a process gas from each of the gas delivery portions 230, 240, 250 into the deposition chamber 110. The plurality of openings 226, 228, 232, 243 may be arranged in any pattern suitable for uniformly depositing process materials onto the substrate 116. In some embodiments, the plurality of openings 226, 228, 232, 243 have a diameter of about 0.1 mm to about 3 mm.

The showerhead and lid assembly 200 includes a plurality of feedthrough plates 218. The plurality of feedthrough plates 218 are configured to allow wires to pass from the showerhead assembly 112 through the lid plate 210. The wires can be heater wires, sensor wires, or the like. In some embodiments, the each of the plurality of feedthrough plates 218 include a plurality of openings 222. In some embodiments, a feedthrough plate 218 is disposed next to each of the plurality of gas delivery portions 220, 230, 240, 250. In some embodiments, one or more heater wires 206 (one shown) are configured to pass through one of the feedthrough plates 218 and into the first gas delivery portion 220.

Figure 3:
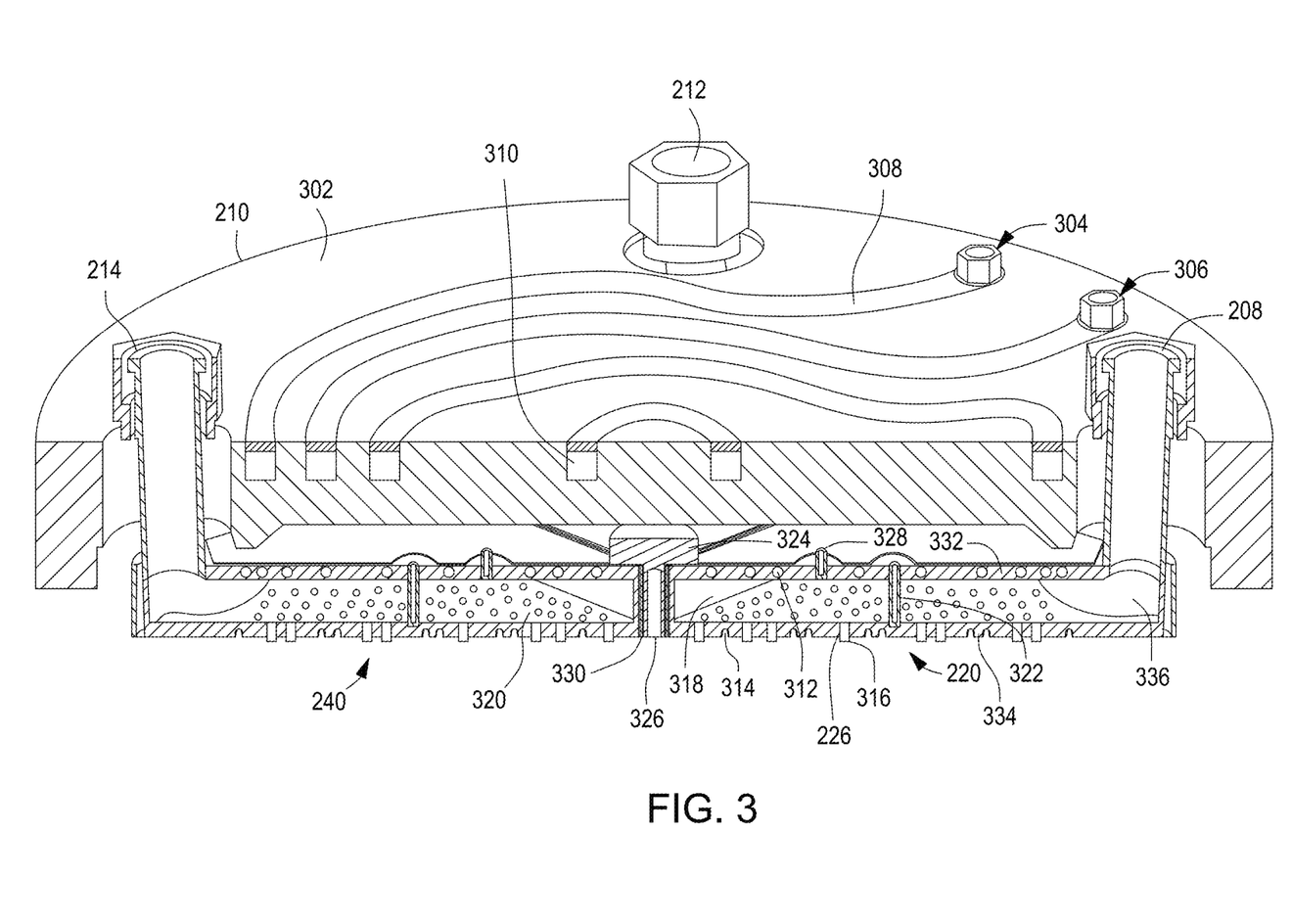
FIG. 3 shows a top isometric cross-sectional view of a showerhead and lid assembly in accordance with some embodiments of the present disclosure.

FIG. 3 shows a top isometric cross-sectional view of a showerhead and lid assembly in accordance with some embodiments of the present disclosure. The lid plate 210 has a top surface 302 opposite the bottom surface 202. In some embodiments, the lid plate 210 includes channels 310 extending from the top surface 302 towards the bottom surface 202. The channels 310 are configured to flow fluid to cool the lid plate 210. In some embodiments, the channels 310 may be partially filled with plugs 308 to seal the channels 310. In some embodiments, the top surface 302 includes a first port 304 and a second port 306. The first port 304 and the second port 306 are configured to flow fluid into and out of the channels 310. The fluid can be coolant, water, or the like.

The first gas delivery portion 220 includes a top wall 332, a bottom wall 334, and sidewalls 336 to define a first plenum 318. Similarly, top walls, bottom walls, and sidewalls of the second, third, and fourth gas delivery portions 230, 240, 250 define a second plenum (inner volume of 230), a third plenum 320, and a fourth plenum (inner volume of 250), respectively. As discussed above, the showerhead assembly 112 may be coupled to the lid plate via the one or more mounts 216 that extend from a radially outer surface of the showerhead assembly 112. The gas delivery portions 220, 230, 240, 250 of the showerhead assembly 112 may be coupled to each other at a central portion of the showerhead assembly 112 with a plug 324 while maintaining the gap 246 therebetween. The plug 324 may have a central opening 326 that is capable of receiving a male portion of a fastener.

In some embodiments, a heat sink 330 is disposed in the gap 246 between adjacent gas delivery portions. In some embodiments, the heat sink 330, has a conductivity of about 150 W/m-K or greater. The heat sink 330 is configured to reduce or prevent heat from a gas delivery portion 220, 230, 240, 250 from radiating to the gas delivery portion 220, 230, 240, 250 that is cooler (i.e., thermal cross-talk). In some embodiments, the heat sink 330 comprises a thermally anisotropic material. A thermally anisotropic material is a material that advantageously has an in-plane thermal conductivity (conductivity in the basal plane) much greater than a transverse thermal conductivity of the material, thus allowing for increased temperature uniformity in the direction of the plane. Thermal Pyrolytic Graphite® (TPG) is an example of a thermally anisotropic material having an in-plane thermal conductivity of about 1,500 W/m-K and a transverse thermal conductivity of about 10 W/m-K. Other examples of suitable anisotropic materials include pyrolytic boron nitride, synthetic diamonds, or the like.

As shown in FIGS. 2 and 3, the plurality of gas delivery portions 220, 230, 240, 250 are similar (i.e., identical). The following discussion will be with respect to the first gas delivery portion 220. However, the same discussion is applicable to the second, third, and fourth gas delivery portions 230, 240, 250. In some embodiments, the top wall 332 of the first gas delivery portion 220 includes channels capable of carrying wires 312 of a resistive heater. In some embodiments, the bottom wall 334 of the first gas delivery portion 220 includes channels 314 capable of carrying wires of a resistive heater. In some embodiments, the first gas delivery portion 220 includes wires 312 in the top wall 332 and wires (e.g. wire 506) disposed in the channels 314 in the bottom wall 334 to advantageously heat the first gas delivery portion 220 uniformly. In some embodiments, the first inlet 208 is capable of being heated by the first heating assembly 125. In some embodiments, a post 322 is disposed through the top wall 332 and at least partially through the bottom wall 334. The post 322 is configured to facilitate measuring a temperature of a bottom end of the post 322 disposed in the bottom wall 334 to provide a temperature measurement of the bottom wall 334. In some embodiments, a post 328 is disposed at least partially through the top wall 332. The post 328 is configured to facilitate measuring a temperature of a bottom end of the post 328 disposed in the top wall 332 to provide a temperature measurement of the top wall 322. For example, in some embodiments, the post 322 and the post 328 are tubes with an upper portion having a central opening and a bottom portion that is solid. The central openings of the post 322 and the post 328 are configured to accommodate respective thermocouples. In some embodiments, at least one of the post 322 and the post 328 are coupled to the one or more first temperature sensors 141.

Figure 4:
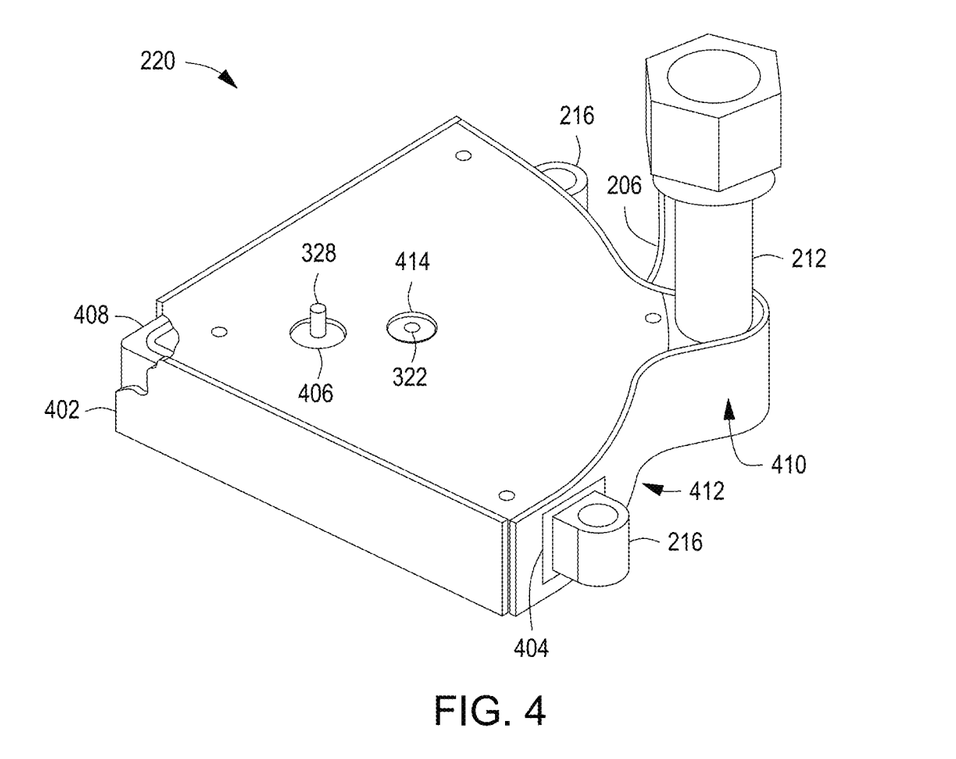
FIG. 4 shows a top isometric view of a gas delivery portion of a showerhead in accordance with some embodiments of the present disclosure.

FIG. 4 shows a top isometric view of a gas delivery portion in accordance with some embodiments of the present disclosure. In some embodiments, the first gas delivery portion 220 includes a wedge shaped body 408 and a curved portion 410 that curves radially outwards from an outer surface 412 of the wedge shaped body 408. The first inlet 208 may be disposed adjacent the curved portion 410.

In some embodiments, the first gas delivery portion 220 includes a heat shield 402 that substantially covers (i.e., envelopes) the wedge shaped body 408. The heat shield 402 includes a plurality of openings that correspond with the plurality of openings 226 of the first gas delivery portion 220. In some embodiments, the heat shield 402 includes an opening 406 for post 328. In some embodiments, the heat shield 402 includes an opening 414 for post 322. In some embodiments, the heat shield 402 includes one or more openings 404 for one or more mounts 216. The heat shield 402 is configured to reduce or prevent heat from radiating from the first gas delivery portion 220 to adjacent gas delivery portions (i.e., thermal cross-talk). The heat shield 402 is formed of stainless steel, aluminum, or the like. The wedge shaped body 408 is formed of a high purity and high thermal resistance material, such as stainless steel, titanium, or the like.

Figure 5:
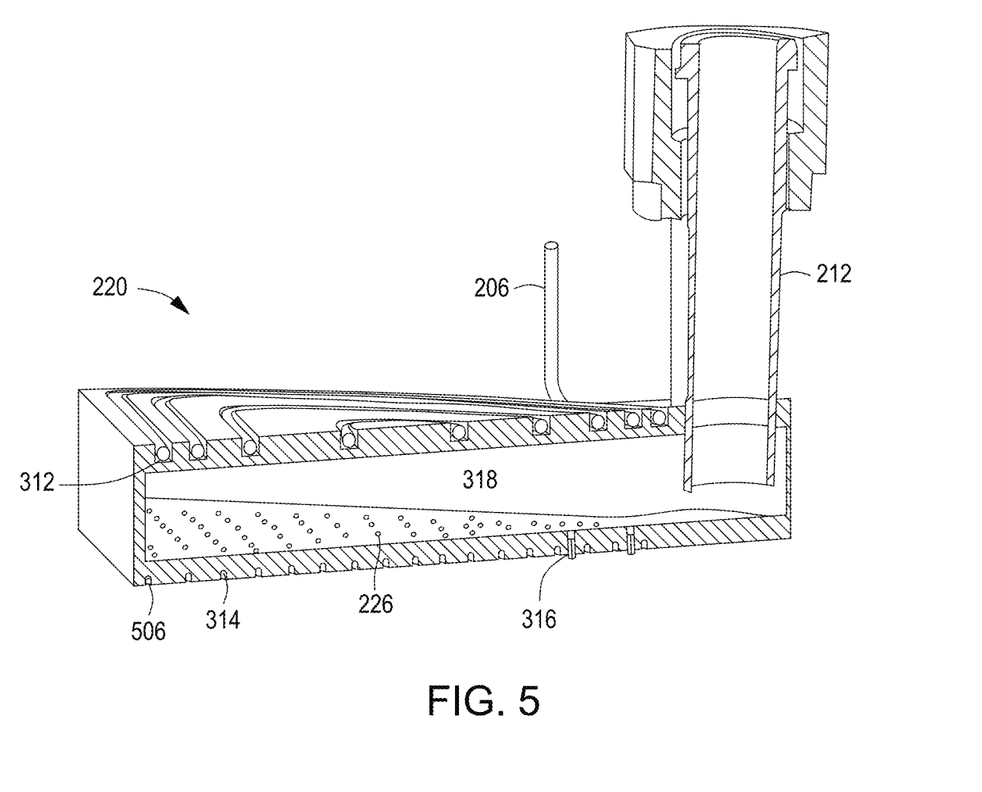
FIG. 5 shows a partial sectional view of a gas delivery portion of a showerhead in accordance with some embodiments of the present disclosure.

FIG. 5 shows a partial sectional view of a gas delivery portion in accordance with some embodiments of the present disclosure. As shown in FIG. 5, a nozzle 316 may be placed in each hole of the plurality of openings 226. In some embodiments, the nozzle 316 can have an inner diameter of about 0.1 mm to about 3 mm. In some embodiments, the nozzle 316 comprises titanium, titanium alloy, or titanium nitride coated steel. The nozzle 316 can be configured to control speed, direction, and flow of process material. The nozzle 316 is configured to spray process material passing from the first plenum 318 into the deposition chamber 110. Spraying of the process material can advantageously increases the uniformity of deposition of the process material onto the substrate 116. Spraying of the process material also advantageously increases the uniformity of mixing of the multiple process materials onto the substrate 116. In some embodiments, wires 506 (only one shown) are disposed in the channels 314 in the bottom wall 334 to heat the first gas delivery portion 220.

While the foregoing is directed to embodiments of the present disclosure, other and further embodiments of the disclosure may be devised without departing from the basic scope thereof.

The invention claimed is:

1. A method of introducing precursors through a segmented showerhead having a plurality of gas delivery portions that are fluidly isolated, comprising:
heating a first gas delivery portion to a first temperature; and
simultaneously heating a second gas delivery portion to a second temperature different than the first temperature, wherein each of the first and second gas delivery portions (i) have a wedge shaped body that is enclosed to define a wedge shaped plenum, (ii) are coplanar, and (iii) together form a showerhead having a circular shape.

2. The method of claim 1, wherein the first temperature is about 200 degrees to about 350 degrees Celsius and the second temperature is about is about 450 degrees to about 600 degrees Celsius.

3. The method of claim 1, further comprising delivering a first process material to the first gas delivery portion and delivering a second process material different from the first process material to the second gas delivery portion.

4. The method of claim 1, further comprising heating a third gas delivery portion to at least one of the first temperature, the second temperature, or a third temperature different than the first temperature and the second temperature.

5. The method of claim 4, further comprising heating a fourth gas delivery portion to at least one of the first temperature, the second temperature, the third temperature, or a fourth temperature.

6. The method of claim 5, wherein the plurality of gas delivery portions consist of the first gas delivery portion, the second gas delivery portion, the third gas delivery portion, and the fourth gas delivery portion that together form the showerhead having the circular shape.

7. The method of claim 1, further comprising placing a heat sink having a conductivity of about 150 W/m-K or greater between the plurality of gas delivery portions prior to heating the first gas delivery portion.

8. The method of claim 1, wherein the plurality of gas delivery portions are arranged such that there is a gap between each gas delivery portion to reduce heat transfer between each gas delivery portion.

9. The method of claim 1, further comprising coupling a first temperature sensor to the first gas delivery portion;
using the first temperature sensor to obtain a temperature reading; and
adjusting the temperature of the first gas delivery portion based on the temperature reading.

10. A method of introducing precursors through a segmented showerhead having a plurality of gas delivery portions that are fluidly isolated, comprising:
heating a first gas delivery portion to a first temperature;
simultaneously heating a second gas delivery portion to a second temperature different than the first temperature; and
heating a third gas delivery portion to at least one of the first temperature, the second temperature, or a third temperature different than the first temperature and the second temperature, wherein each of the first and second and third gas delivery portions are spaced from each other via a gap disposed therebetween and (i) have a wedge shaped body that defines a plenum, (ii) are coplanar, and (iii) together form a showerhead having a circular shape.

11. The method of claim 10, further comprising heating a fourth gas delivery portion to at least one of the first temperature, the second temperature, the third temperature, or a fourth temperature.

12. The method of claim 11, wherein the first gas delivery portion and the third gas delivery portion are heated to the third temperature.

13. The method of claim 12, wherein the second gas delivery portion and the fourth gas delivery portion are heated to the second temperature.

14. The method of claim 12, wherein the second gas delivery portion is heated to the second temperature and the fourth gas delivery portion is heated to the fourth temperature.

15. The method of claim 11, wherein the plurality of gas delivery portions consist of the first gas delivery portion, the second gas delivery portion, the third gas delivery portion, and the fourth gas delivery portion that together form the showerhead having the circular shape.

16. A method of introducing precursors through a segmented showerhead having a plurality of gas delivery portions that are fluidly isolated, comprising:
heating a first gas delivery portion to a first temperature;
simultaneously heating a second gas delivery portion to a second temperature different than the first temperature;
heating a third gas delivery portion to at least one of the first temperature, the second temperature, or a third temperature different than the first temperature and the second temperature; and
heating a fourth gas delivery portion to at least one of the first temperature, the second temperature, the third temperature, or a fourth temperature, wherein each of the plurality of gas delivery portions (i) have a wedge shaped body that is enclosed to define a wedge shaped plenum, (ii) are coplanar, and (iii) together form a showerhead having a circular shape.

17. The method of claim 16, further comprising placing a heat sink having a conductivity of about 150 W/m-K or greater between the plurality of gas delivery portions prior to heating the first gas delivery portion.

18. The method of claim 16, wherein the first gas delivery portion and the third gas delivery portion are heated to the first temperature and the second gas delivery portion and the fourth gas delivery portion are heated to the second temperature.

19. The method of claim 16, further comprising:
flowing a first process material through the first gas delivery portion; and flowing a second process material through the second gas delivery portion.

20. The method of claim 16, further comprising flowing a first process material through both the first gas delivery portion and the third gas delivery portion.

\* \* \* \* \*